(12) United States Patent
Kim et al.

(10) Patent No.: US 10,756,270 B2
(45) Date of Patent: Aug. 25, 2020

(54) MULTI ARRAY ELECTRODE HAVING PROJECTING ELECTRODE PARTS ARRAYED THEREON, METHOD OF MANUFACTURING THE SAME, AND METHOD OF MANUFACTURING ORGANIC DEPOSITION MASK USING THE MULTI ARRAY ELECTRODE

(71) Applicant: ANYCASTING CO., LTD., Seoul (KR)

(72) Inventors: Sung Bin Kim, Seoul (KR); Chan Kyu Park, Seoul (KR); Kun Woong Ko, Seoul (KR)

(73) Assignee: ANYCASTING CO., LTD., Seoul (KR)

( * ) Notice: Subject to any disclaimer, the term of this patent is extended or adjusted under 35 U.S.C. 154(b) by 0 days.

(21) Appl. No.: 16/217,044

(22) Filed: Dec. 11, 2018

(65) Prior Publication Data

US 2020/0152875 A1 May 14, 2020

(30) Foreign Application Priority Data

Nov. 13, 2018 (KR) .......................... 10-2018-0139454

(51) Int. Cl.
*H01L 51/00* (2006.01)
*H01L 51/52* (2006.01)
(Continued)

(52) U.S. Cl.
CPC ...... *H01L 51/0011* (2013.01); *H01L 51/0014* (2013.01); *H01L 51/5203* (2013.01);
(Continued)

(58) Field of Classification Search
CPC ............. H01L 51/0011; H01L 51/0014; H01L 51/5203; C23F 1/02; C23F 1/28; C23F 4/00; B23H 3/04; C25F 3/06
See application file for complete search history.

(56) References Cited

U.S. PATENT DOCUMENTS 3,679,500 A * 7/1972 Kubo ..................... B41J 2/1433
216/56
4,662,984 A * 5/1987 Ohtake ................... H01J 9/142
216/12
(Continued)

*Primary Examiner* — Anita K Alanko
(74) *Attorney, Agent, or Firm* — Park, Kim & Suh, LLC

(57) ABSTRACT

Provided is a method of manufacturing an organic deposition mask used in manufacturing of an organic light emitting diode (OLED). More specially, provided is a method of manufacturing an organic deposition mask by which fine deposition openings may be formed on a thin board by electrochemical machining (ECM) using a multi array electrode having projecting electrode parts arrayed thereon. According to an embodiment of the present invention, the method of manufacturing an organic deposition mask including deposition openings formed of first openings facing a deposition source and second openings facing a deposited object, the method may include: forming the first openings on one side of a thin board; and forming the second openings on an opposite side of the thin board by electrochemical machining (ECM) using a second multi array electrode having second projecting electrode parts arrayed thereon so as to communicate with the first openings.

17 Claims, 14 Drawing Sheets

(51) Int. Cl.
*C23F 1/02* (2006.01)
*C23F 1/28* (2006.01)
*B23H 3/04* (2006.01)
*C25F 3/06* (2006.01)
*C23F 4/00* (2006.01)

(52) U.S. Cl.
CPC .............. *B23H 3/04* (2013.01); *C23F 1/02* (2013.01); *C23F 1/28* (2013.01); *C23F 4/00* (2013.01); *C25F 3/06* (2013.01)

(56) References Cited

U.S. PATENT DOCUMENTS

| | | | | |
|---|---|---|---|---|
| 6,139,716 | A * | 10/2000 | McCarthy | C25F 3/12 |
| | | | | 205/665 |
| 7,531,216 | B2 * | 5/2009 | Brody | C23C 14/042 |
| | | | | 427/248.1 |
| 10,151,041 | B2 * | 12/2018 | Han | C25D 1/10 |
| 2002/0036455 | A1 * | 3/2002 | Den Engelsen | H01J 9/146 |
| | | | | 313/402 |
| 2018/0038002 | A1 * | 2/2018 | Tamura | C25C 7/08 |
| 2018/0138408 | A1 * | 5/2018 | Lassiter | C23C 14/56 |
| 2019/0252614 | A1 * | 8/2019 | Jang | H01L 51/001 |
| 2019/0259950 | A1 * | 8/2019 | Jung | C23F 1/28 |
| 2019/0259951 | A1 * | 8/2019 | Seong | H01L 21/027 |
| 2020/0019056 | A1 * | 1/2020 | Ikenaga | C23F 1/28 |
| 2020/0091432 | A1 * | 3/2020 | Inuzuka | C23C 14/16 |

* cited by examiner

MULTI ARRAY ELECTRODE HAVING PROJECTING ELECTRODE PARTS ARRAYED THEREON, METHOD OF MANUFACTURING THE SAME, AND METHOD OF MANUFACTURING ORGANIC DEPOSITION MASK USING THE MULTI ARRAY ELECTRODE

CROSS-REFERENCE TO RELATED PATENT APPLICATION

This application claims the benefit of Korean Patent Application No. 10-2018-0139454, filed on Nov. 13, 2018, in the Korean Intellectual Property Office, the disclosure of which is incorporated herein in its entirety by reference.

BACKGROUND OF THE INVENTION

1. Field of the Invention

The present invention relates to a method of manufacturing an organic deposition mask used in manufacturing of an organic light emitting diode (OLED) and a multi array electrode used in manufacturing of the organic deposition mask.

2. Description of the Related Art

Organic light emitting diodes (OLED) are receiving wide attention in a field of display and lighting since not only flexible board but also properties such as sensitive screen realization, high response speed, self-light emitting, thin panel production, low power, and a wide viewing angle may be available in the OLEDs.

In particular, OLED display devices are self-emitted and do not require a separate light source differently from a liquid crystal display device. Accordingly, the OLED display devices may have a reduced thickness and weight and have high-grade properties such as a wide viewing angle, low power consumption, high brightness, and high response speed.

In this OLED display device, a number of subpixels is formed in one pixel and each subpixel may be formed during manufacturing of the OLED display devices by using various methods. One of the methods is deposition.

In order to form subpixels by using deposition, a fine metal mask (FMM) including deposition openings having a pattern that is the same as a pattern of a thin film, which is to be formed on a display panel, is required.

That is, the FMM is used to deposit an organic matter on a display panel during manufacturing of an OLED display device and to form a pixel pattern on the display panel and is a metal sheet including deposition openings having a pattern that is the same as the pixel pattern, which is to be formed on the display panel.

Briefly, in the deposition, the FMM including deposition openings having a pattern that is the same as a pattern of a thin film, which is to be formed on a display panel, is interposed between a deposition source disposed at the bottom of a chamber and a display panel. Then, when an organic matter is heated from the deposition source, heated organic matter is evaporated and the evaporated organic matter passes through the deposition openings of the FMM disposed on the upper part so as to be deposited on the display panel. Then, a thin film having a desired pattern, that is, a pixel pattern, is formed on the display panel.

The FMM significantly affects a quality of OLED display device and the entire yield and thus, importance of the FMM rises.

Recently, since display devices with ultra high definition (UHD) are required in various electronic devices such as virtual reality (VR) devices, the FMM having micro scale deposition openings, which may form a UHD pattern, is required.

In general, a method of manufacturing such FMM includes etching and electro forming.

In etching, a resist layer having a pattern of deposition openings is formed on a thin board by a photoresist process or a film having a pattern of deposition openings is attached on a thin board and then, the thin board is etched.

However, in the method of manufacturing the FMM by etching, a tolerance of widths and edges of the deposition openings may not be accurately matched due to enlargement of the FMM and a micro scale pattern of the deposition opening. In particular, when a thin board is etched to manufacture the FMM, the thin board may be over etched or under etched and a size of the deposition openings may not be uniformly formed.

In electro forming, electrolytic plating is performed on a mold and is released to manufacture a thin board. As in electro plating, a metal is deposited on a mold with a desired thickness using electrolysis by a metallic salt solution and then, the metal is separated from the mold. Then, an electric casting, in which the mold and projection are opposites, is formed. The electro forming is one of the methods of manufacturing the FMM by using such principle.

In the method of manufacturing the FMM using electro forming, a plating layer needs to be separated from the mold. However, high accuracy may not be available and a thin board may be twisted during a plating process.

Recently, separately etching a lower side and an upper side of a thin board or a method using a laser is used to solve problems of etching and electro forming. However, it takes a long time to form deposition openings on a thin board by using a laser and a burr may be generated around the deposition openings due to a high temperature heat source. Thus, the surface of the thin board may not be smooth.

SUMMARY OF THE INVENTION

The present invention provides a method of manufacturing an organic deposition mask by which fine deposition openings may be formed on a thin board by electrochemical machining (ECM) using a multi array electrode having projecting electrode parts arrayed thereon.

The present invention also provides a multi array electrode having projecting electrode parts arrayed thereon so as to minutely form fine holes, wherein the multi array electrode may be used in manufacturing of an organic deposition mask including fine deposition openings, and a method of manufacturing the multi array electrode.

According to an aspect of the present invention, there is provided a method of manufacturing an organic deposition mask comprising deposition openings formed of first openings facing a deposition source and second openings facing a deposited object, the method including: forming the first openings on one side of a thin board; and forming the second openings on an opposite side of the thin board by electrochemical machining (ECM) using a second multi array electrode having second projecting electrode parts arrayed thereon so as to communicate with the first openings.

According to another aspect of the present invention, there is provided a multi array electrode having projecting electrode parts arrayed thereon, the multi array electrode including: a substrate; projecting parts arrayed on one side of the substrate; and a plating layer formed on the surface of the substrate, wherein the projecting electrode parts are formed by forming the plating layer on the surface of the projecting parts.

According to another aspect of the present invention, there is provided a method of manufacturing a multi array electrode having projecting electrode parts arrayed thereon, the method including: forming pattern areas for forming projecting electrode parts on one side of a substrate; forming projecting parts for forming the projecting electrode parts on the one side of the substrate by etching the one side of the substrate, on which the pattern areas are formed; and forming a plating layer on the surface of the substrate, wherein the projecting electrode parts are formed by forming the plating layer on the surface of the projecting parts.

BRIEF DESCRIPTION OF THE DRAWINGS

The above and other features and advantages of the present invention will become more apparent by describing in detail exemplary embodiments thereof with reference to the attached drawings in which:

FIG. 6 is an example schematically illustrating a process of forming second openings;

FIGS. 10 through 13 illustrate processes in the method of manufacturing an organic deposition mask according to the second embodiment of the present invention, wherein FIG. 10 is an example schematically illustrating a process of forming first openings according to the second embodiment of the present invention, FIG. 11 schematically illustrates a thin board formed after the first openings are formed according to the second embodiment of the present invention, FIG. 12 is an example schematically illustrating a process of forming second openings, and FIG. 13 schematically illustrates an organic deposition mask manufactured by using the method of manufacturing an organic deposition mask according to the second embodiment of the present invention;

DETAILED DESCRIPTION OF THE INVENTION

Figure 1:
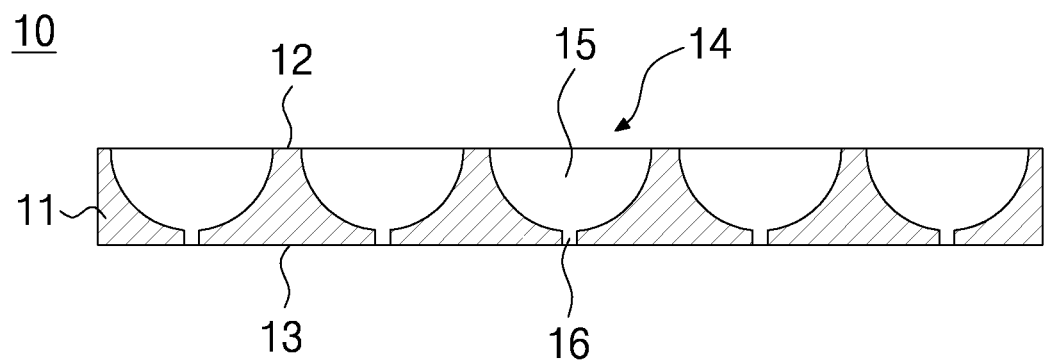
FIG. 1 schematically illustrates an organic deposition mask according to an embodiment of the present invention.

Hereinafter, embodiments of the present invention will be described more fully with reference to the accompanying drawings. In the drawings, like reference numerals denote like elements and overlapped descriptions will be omitted.

It will be understood that, although the terms first, second, etc. may be used herein to describe various elements, these elements should not be limited by these terms. These terms are only used to distinguish one element from another.

It will be further understood that when a part "includes" an element, it species the further presence of other elements instead of excluding other elements, unless there is no contrary description.

In the drawings, the thicknesses and sizes of layers (films), areas, patterns or structures may be modified for clarity and convenience of description and thereby, do not fully reflect actual sizes. In the description of embodiments, when each layer (film), area, pattern, or structure is referred to as being "formed over", "formed on", or "formed under" each layer (film), area, pattern, or structure, it may be directly formed on or indirectly formed on the other elements while intervening layers may be present.

In addition, the term "on" used herein may denote an element locates above or under a target object and may not be always construed as being located above a target object based on the direction of gravity.

Each embodiment may be independently performed or performed along with other embodiments and elements may partially excluded according to the purpose of the invention.

In the present invention, an organic deposition mask denotes a thin board, where deposition openings are formed in order to form an organic matter thin film pattern on the surface of organic deposition during manufacturing of an organic light emitting diode (OLED), and may be a fine metal mask (FMM) for forming pixels on a display panel during manufacturing of an OLED display device. However, the present invention is not limited thereto.

The organic deposition mask is firstly described below for convenience of understanding, before a method of manufacturing the organic deposition mask according to an embodiment of the present invention is described.

FIG. 1 schematically illustrates an organic deposition mask 10 according to an embodiment of the present invention.

Referring to FIG. 1, the organic deposition mask 10 includes a thin board 11 and a pattern of deposition openings 14 formed on the thin board 11.

The thin board 11 may be an INVAR sheet. The INVAR is an alloy of 64% of Fe and 36% of Ni and has a significantly low coefficient of thermal expansion. The thickness of the INVAR thin board 11 may be about 20 μm.

The deposition openings 14 are paths through which organic molecules evaporated from a deposition source in a deposition process pass toward a deposited object and may include first openings 15 facing the deposition source formed on one side 12 of the thin board 11 and second openings 16 facing the deposited object formed on an opposite side 13 of the thin board 11 so as to communicate with the first openings 15.

Also, the pattern of the deposition openings 14 may be the same as a pattern of a thin film which is to be formed on the surface of organic deposition.

For example, the pattern of the deposition openings 14 may be a pixel pattern which is to be formed on a display panel during manufacturing of an OLED display device and the size of the second openings 16 may be the same as a size of sub pixels which are to be formed on the display panel.

Also, a cross-section of the deposition openings 14, in particular, a cross-section of the second openings 16, is the same as a form of sub pixels which are to be formed on the display panel, that is, a form according to a pixel form included in an OLED display device and may have various forms such as a circle and a rectangle.

In addition, the pattern of the deposition openings 14 may be the pattern where a plurality of deposition openings 14 are arrayed at regular intervals.

The width of the first openings 15 may be greater than that of the second openings 16 so that an incidence angle may be restricted in a deposition process of organic light emitting materials through the deposition openings 14 and a deposition film may be prevented from being unevenly formed.

Hereinafter, a method of manufacturing an organic deposition mask according to various embodiments of the present invention will be described in detail with reference to the drawings.

Figure 2:
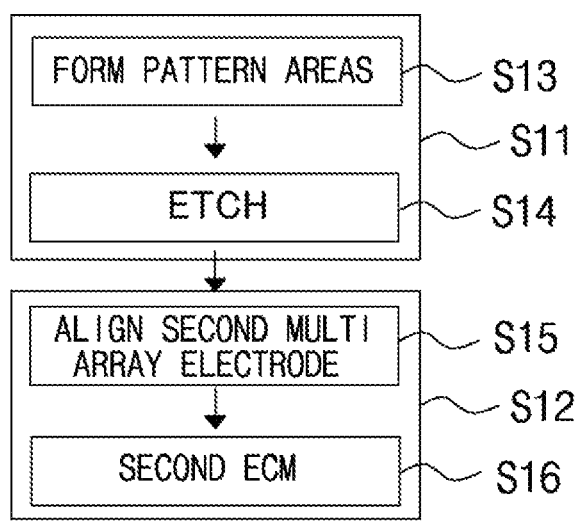
FIG. 2 is a flowchart illustrating a method of manufacturing an organic deposition mask according to a first embodiment of the present invention.

FIG. 2 is a flowchart illustrating a method S10 of manufacturing an organic deposition mask according to a first embodiment of the present invention and FIGS. 3 through 6 illustrate processes in the method S10 of manufacturing an organic deposition mask according to the first embodiment of the present invention.

Firstly, referring to FIG. 2, the method S10 of manufacturing an organic deposition mask 10 according to the first embodiment of the present invention may include forming the first openings 15 on the one side 12 of the thin board 11 in operation S11 and forming the second openings 16 on the opposite side 13 of the thin board 11 so as to communicate with the first openings 15 in operation S12.

In forming the first openings 15 in operation S11, the first openings 15 may be formed by etching.

For example, forming the first openings 15 in operation S11 may include forming pattern areas 17 on the one side 12 of the thin board 11 in operation S13 and etching the pattern areas 17 by a predetermined thickness so as to form the first openings 15 on the one side 12 of the thin board 11 in operation S14.

Figure 3:
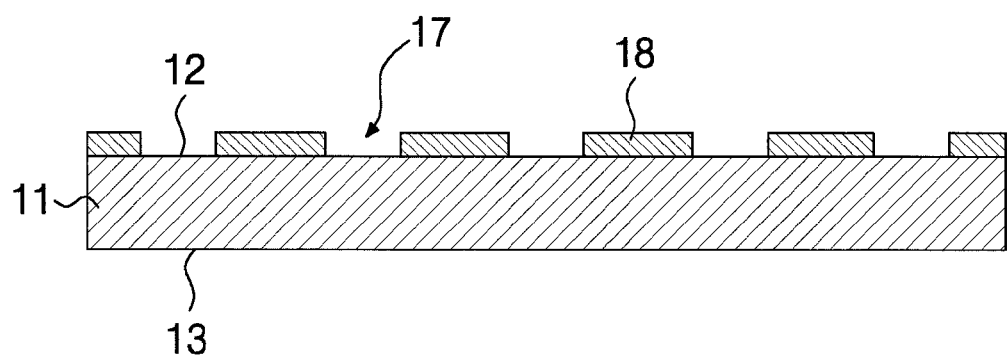
FIGS. 3 through 6 illustrate processes in the method of manufacturing an organic deposition mask according to the first embodiment of the present invention, wherein FIG. 3 schematically illustrates that pattern areas are formed on a thin board, FIG. 4 schematically illustrates that first openings are formed on a thin board by wet etching, FIG. 5 schematically illustrates that photoresists are removed from FIG. 4.

FIG. 3 schematically illustrates that the pattern areas are formed on the thin board.

Referring to FIG. 3, in forming the pattern areas in operation S13, the pattern areas 17 may be formed by using photoresists 18.

The photoresists 18 are materials that cause chemical changes, if light is irradiated, and classified into a negative type and a positive type, wherein the photoresists 18 become insoluble against chemicals after being exposed to light in the negative type and become soluble against chemical after being exposed to light in the positive type.

In forming the pattern areas 17 by using the photoresists 18 in operation S13, the photoresists 18 are coated on the one side 12 of the thin board 11, a photo mask including the pattern areas 17 is placed on the photoresists 18, light is irradiated to the photo mask, the photoresists 18, to which light is irradiated, are developed, and thereby, the pattern areas 17 may be formed on the one side 12 of the thin board 11, on which the photoresists 18 are coated.

Here, when the photoresists 18 are the negative type, a part excluding the pattern areas 17 only remains through the developing process. When the photoresists 18 are the positive type, the pattern areas 17 only remain through the developing process.

As illustrated in FIG. 3, in forming the pattern areas 17 in operation S13 according to the current embodiment of the present invention, the negative type photoresists 18 may be used.

In the current embodiment of the present invention, the photoresists 18 are used to form the pattern areas 17, however, the present invention is not limited thereto. For example, a dry film photoresist (DFP) may be used to form the pattern areas 17 and the present invention is not restricted by the forming of the pattern areas 17.

Figure 4:
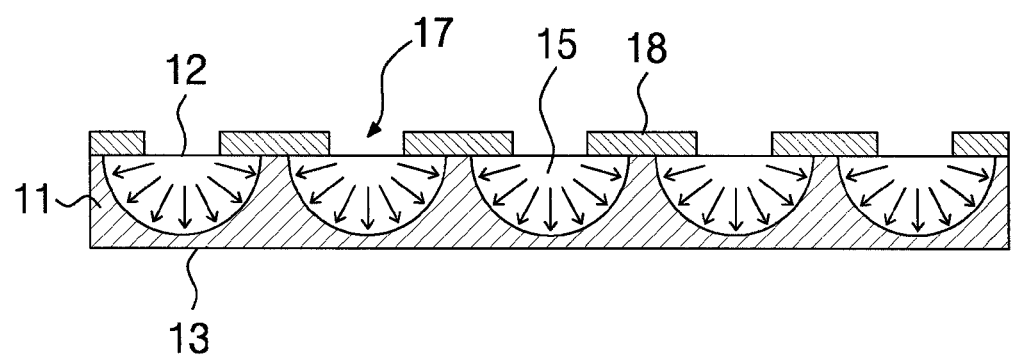

FIG. 4 schematically illustrates that the first openings are formed on the thin board by wet etching.

As illustrated in FIG. 4, in etching the pattern areas 17 in operation S14, the first openings 15 may be formed in the pattern areas 17 by wet etching, wherein the pattern areas 17 are formed on the one side 12 of the thin board 11.

In wet etching, soluble chemicals are used to selectively dissolve and etch a part, which needs to be removed. Since the wet etching in FIG. 4 is an isotropic etching, upper parts of the photoresists 18, which form the pattern areas 17, are etched and thereby, the etched part may be wider than the width of the pattern areas 17.

Also, the wet etching may be performed by immersing the thin board 11 including the pattern areas 17 in soluble chemicals. In this case, in order for the opposite side 13 of the thin board 11 not to be etched, the photoresists 18 may be coated on the whole opposite side 13 of the thin board 11.

Figure 5:
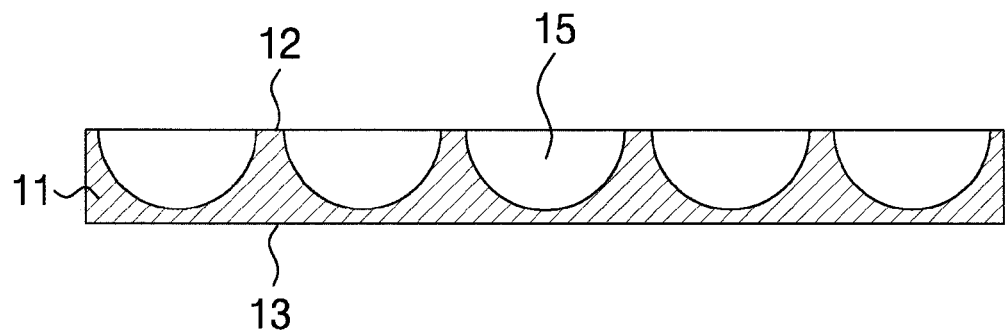

FIG. 5 schematically illustrates that the photoresists are removed from FIG. 4.

As illustrated in FIG. 5, when the photoresists 18 remaining on the thin board 11 are removed after the first openings 15 are formed in the pattern areas 17 by wet etching in etching in operation S14, the semicircle-form first openings 15 having a large width and a predetermined depth may be formed on the one side 12 of the thin board. 11.

Figure 6:
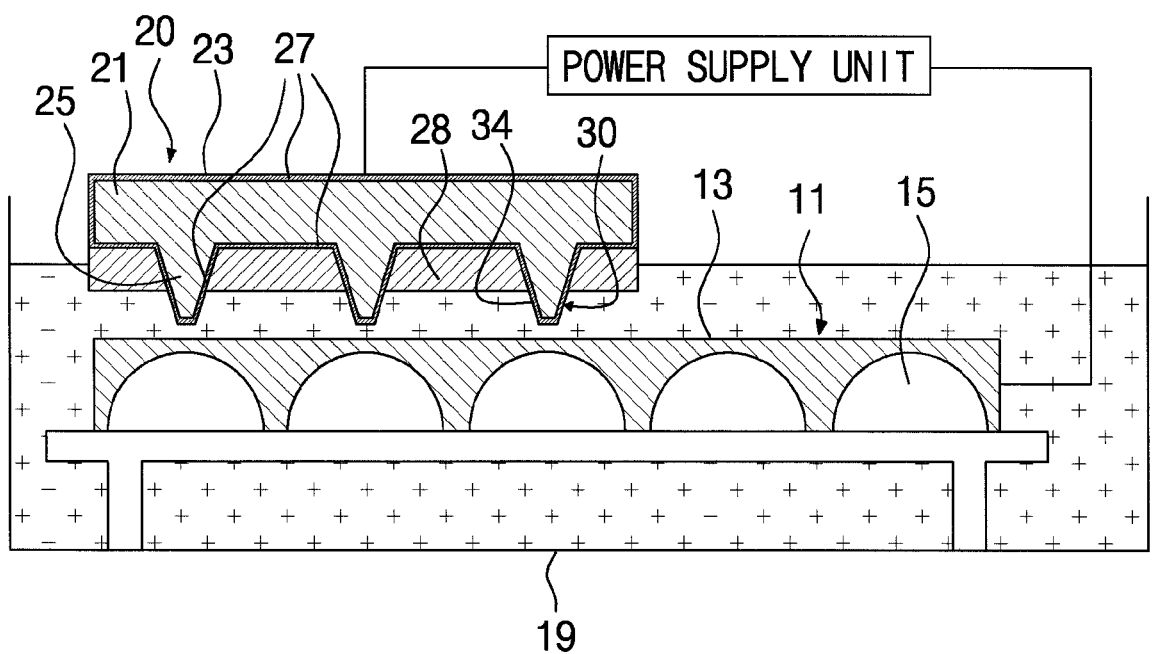

FIG. 6 is an example schematically illustrating a process of forming the second openings 16.

Referring to FIG. 6, in forming the second openings 16 in operation S12, the second openings 16 may be formed on the opposite side 13 of the thin board 11 so as to communicate with the first openings 15 by electrochemical machining (ECM) using a second multi array electrode 20 having second projecting electrode parts 30 arrayed thereon.

The ECM is a way through which metallic oxides generated during electrochemical dissolution of metallic materials are removed, wherein the metallic oxides are gas from a cathode and anode products and disturb the electrochemical dissolution.

For example, an electrode and a processed object are respectively made to be a cathode and an anode and face each other at a predetermined interval.

Then, the electrode and the processed object are immersed in an electrolyte. When a current is applied, the processed object may be processed as a surface form of the cathode.

That is, in the method S10 of manufacturing an organic deposition mask according to the first embodiment of the present invention, the first openings 15 are formed by wet etching and the second openings 16 are formed by ECM using the second multi array electrode 20 having the second projecting electrode parts 30 arrayed thereon.

The first openings 15 face the deposition source and may need to be formed to have a large width and depth at a high speed as compared with the second openings 16, whereas the second openings 16 face the deposited object and may need to be formed closely and minutely, since the second openings 16 forms the pattern of the thin board which is to be directly formed on an organic deposition surface.

In regard to this, in the method S10 of manufacturing an organic deposition mask according to the first embodiment of the present invention, the first openings 15 are formed by wet etching at a high speed, the width and depth of the first openings 15 are greater than those of the second openings 16, and the second openings 16 are closely and minutely formed by using the second multi array electrode 20 having the second projecting electrode parts 30 arrayed thereon.

In more detail, forming the second openings in operation S12 may include aligning the second multi array electrode in operation S15, wherein the second multi array electrode 20 is aligned on and spaced apart from the opposite side 13 of the thin board 11 so that the second projecting electrode parts 30 may face the first openings 15, and second ECM in operation S16, wherein power is applied to the thin board 11 and the second projecting electrode parts 30, while the thin board 11 including the first openings 15 and the second projecting electrode parts 30 are immersed in an electrolyte, and the second openings 16 are formed on the opposite side 13 of the thin board 11 to communicate with the first openings 15.

As illustrated in FIG. 6, forming the second openings in operation S12 may be performed while the thin board 11 including the first openings 15 and the second projecting electrode parts 30 are spaced apart from each other and immersed in a processing tub 19 filled with an electrolyte, the thin board 11 and the second projecting electrode parts 30 are electrically connected with each other, and power is applied to the thin board 11 and the second projecting electrode parts 30 through a power supply unit.

Here, when the second projecting electrode parts 30 and the thin board 11 are respectively made to be a cathode and an anode and power is applied thereto, the opposite side 13 of the thin board 11 is processed to have the same forms as the cross-sections of the second projecting electrode parts 30 facing the opposite side 13 of the thin board 11 and thereby, the second openings 16 communicating with the first openings 15 may be formed.

The cross-sections of the second projecting electrode parts 30 may be the same as the cross-sections of the second openings 16, which are to be formed. That is, the cross-sections of the second projecting electrode parts 30 may be the same as the thin film which is to be formed on an organic deposition surface. For example, the cross-sections of the second projecting electrode parts 30 are the same as forms of subpixels which are to be formed on a display panel during manufacturing of an OLED display device, that is, forms according to a form of pixel included in an OLED display device, and may have various forms such as a circle and a rectangle.

Also, intervals of the second projecting electrode parts 30 arrayed on the second multi array electrode 20 may be the same as the intervals of the second openings 16 arrayed on the opposite side 13 of the thin board 11.

Then, in second ECM in operation S16, the second openings 16 may be closely and minutely formed on the opposite side 13 of the thin board 11 by the second projecting electrode parts 30.

Here, the second projecting electrode parts 30 may each have inclined sides 34 which become narrow toward the end parts thereof and thereby, the second projecting electrode parts 30 may have a tapered form.

Then, in second ECM in operation S16, when a current is applied to the second projecting electrode parts 30, the current may be centered to the end parts of the second projecting electrode parts 30 and thus, efficiency of ECM may increase.

Hereinafter, the second multi array electrode 20 according to an embodiment of the present invention will be described in detail with reference to the drawings.

Figure 7:
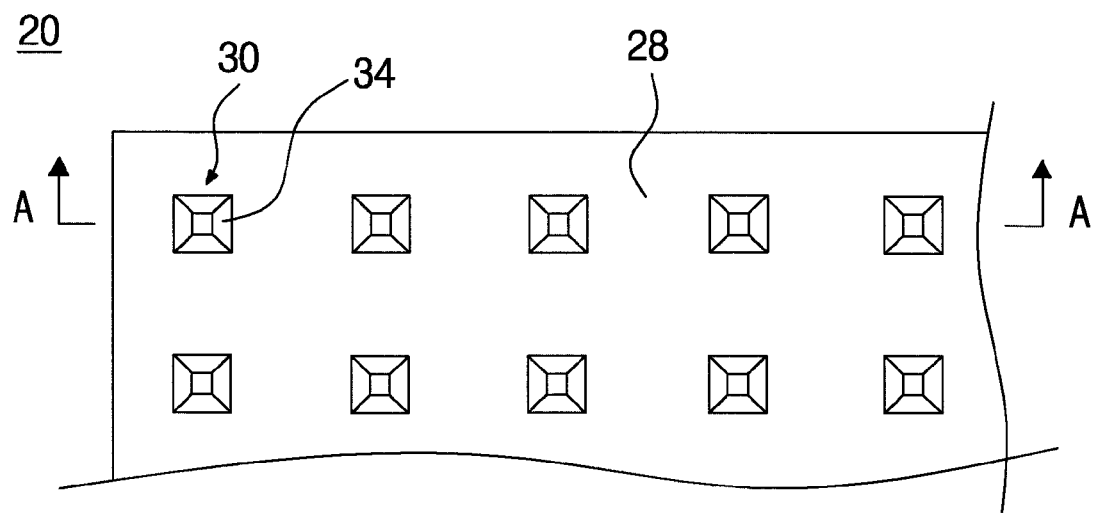
FIG. 7 is a partial plane view schematically illustrating a second multi array electrode according to an embodiment of the present invention.
Figure 8:
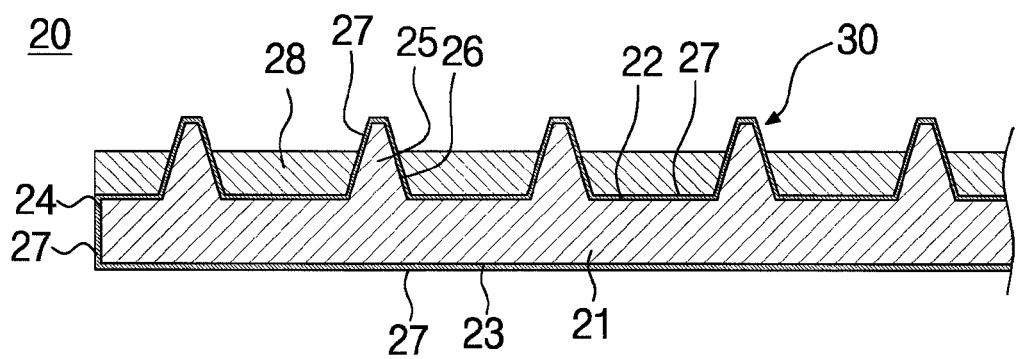
FIG. 8 is a cross-sectional view schematically illustrating the second multi array electrode of FIG. 7 sectioned by A-A of FIG. 7.

FIG. 7 is a partial plane view schematically illustrating the second multi array electrode 20 according to an embodiment of the present invention and FIG. 8 is a cross-sectional view schematically illustrating the second multi array electrode 20 sectioned by A-A of FIG. 7.

Referring to FIGS. 7 and 8, the second multi array electrode 20 according to an embodiment, of the present invention may include a second substrate 21, second projecting parts 25 arrayed on one side 22 of the second substrate 21, and a second plating layer 27 formed on the surface of the second substrate 21.

Here, the second projecting electrode parts 30 may be formed by forming the second plating layer 27 on the surface of the second projecting parts 25.

The second substrate 21 may be a Si wafer. Then, the second substrate 21 may have an excellent flatness and a plurality of micro-form second projecting parts 25 may be formed on the second substrate 21 for ECM.

The second projecting parts 25 are frames of the second projecting electrode parts 30 and may have the same form as the form of the second projecting electrode parts 30. Also, the second projecting parts 25 may be arrayed as in the same manner as in the arrayed pattern of the second projecting electrode parts 30.

That is, the second projecting parts 25 may each have inclined sides 36 which become narrow toward the end parts of the second projecting parts 25 and thereby, the second projecting parts 25 may have a tapered form.

Also, the pattern of the second projecting parts 25 arrayed on the second substrate 21 may be the same as the pattern of the second openings 16, that is, the pattern of the thin film which is to be formed on an organic deposition surface. Accordingly, intervals of the second projecting parts 25 arrayed on the second substrate 21 may be the same as the intervals of the second openings 16 arrayed on the opposite side 13 of the thin board 11.

For example, the pattern of the second projecting parts 25 may be a pixel pattern which is to be formed on a display panel during manufacturing of an OLED display device and the intervals of the second projecting parts 25 arrayed on the second substrate 21 may be intervals of the subpixels which are to be formed on a display panel during manufacturing of an OLED display device.

In addition, although the cross-sections of the second projecting parts 25 are squares according to the drawing, the present invention is not limited thereto and the cross-sections of the second projecting parts 25 may be the same as the cross-sections of the second openings 16 which are to be formed. That is, the cross-sections of the second projecting parts 25 may have the same form as a thin film which is to be formed on an organic deposition surface.

For example, the cross-sections of the second projecting parts 25 may be the same as forms of subpixels which are to be formed on a display panel during manufacturing of an OLED display device, that is, forms according to a form of pixel included in an OLED display device, and may have various forms such as a circle and a rectangle.

In addition, although the vertical sections of the second projecting parts 25 are trapezoids according to the drawing, the present invention is not limited thereto and the vertical sections of the second projecting parts 25 may have a conical form having a sharp end parts such as a quadrangular pyramid and a circular cone.

The second multi array electrode 20 may further include a second insulator part 28 interposed between the second projecting electrode parts 30. The second insulator part 28 is used to prevent diffusion of a current when a current is applied to the second projecting electrode parts 30 in second ECM in operation S16.

The second plating layer 27 may be formed on the entire surface of the second substrate 21, that is, the one side 22 and an opposite side 23 of the second substrate 21, the surface of the second projecting parts 25, and sides 24 of the second substrate 21.

Then, the second projecting electrode parts 30 and the opposite side 23 of the second substrate 21 may be electrically connected to each other through the second plating layer 27. Accordingly, in second ECM in operation S16, a current may be applied to the whole second projecting electrode parts 30 through the opposite side 23 of the one side 22 of the second substrate 21, on which the second projecting electrode parts 30 are arrayed.

Figure 9:
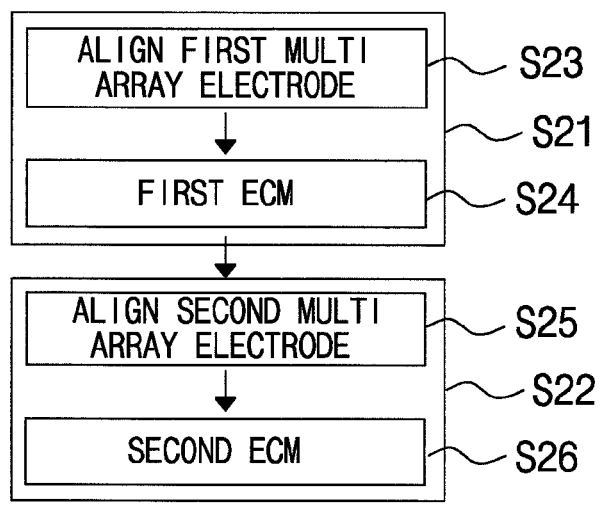
FIG. 9 is a flowchart illustrating a method of manufacturing an organic deposition mask according to a second embodiment of the present invention.

FIG. 9 is a flowchart illustrating a method S20 of manufacturing an organic deposition mask according to a second embodiment of the present invention and FIGS. 10 through 13 illustrate processes in the method S20 of manufacturing an organic deposition mask according to the second embodiment of the present invention.

Referring to FIG. 9, in the method S20 of manufacturing an organic deposition mask, the first openings 15 may be formed in operation S21 by using ECM, instead of etching, as in forming of the second openings in operation S22.

Figure 10:
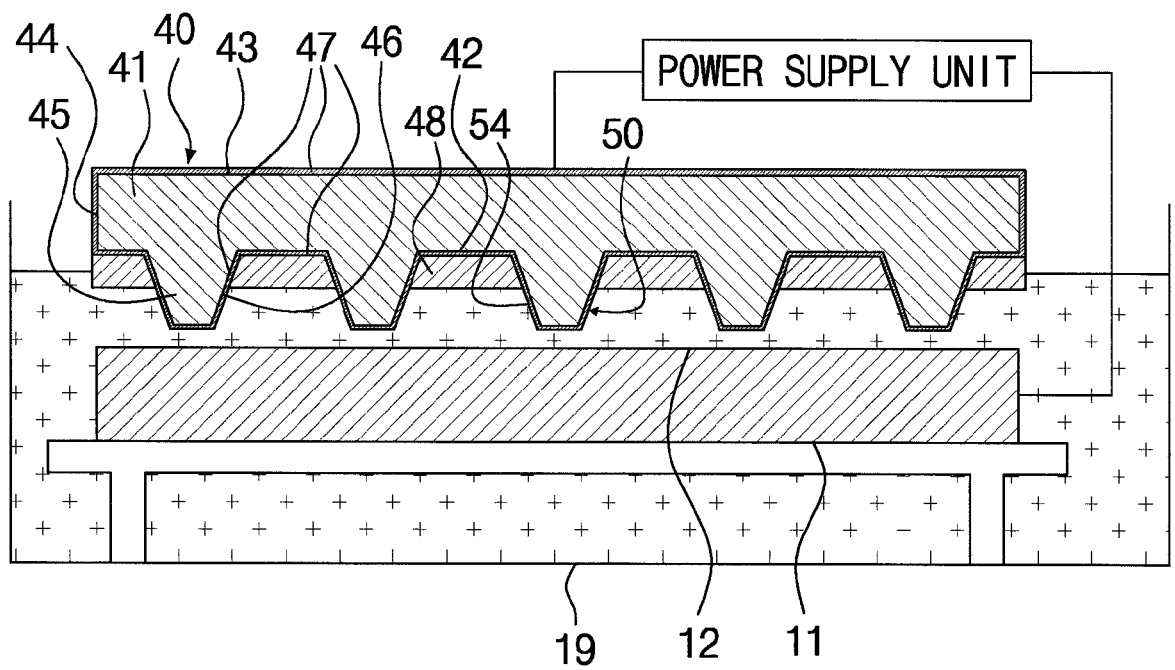
Figure 11:
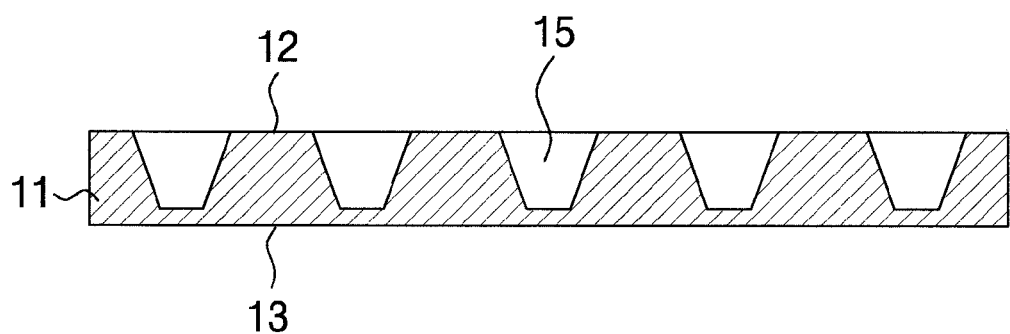

FIG. 10 is an example schematically illustrating a process of forming the first openings 15 according to the second embodiment of the present invention and FIG. 11 schematically illustrates the thin board 11 formed after the first openings 15 are formed according to the second embodiment of the present invention.

Referring to FIGS. 9 through 11, forming of the first openings in operation S21 according to the second embodiment of the present invention may include aligning a first multi array electrode in operation S23, wherein a first multi array electrode 40 having first projecting electrode parts 50 arrayed thereon is aligned on and spaced apart from the one side 12 of the thin board 11, and first ECM in operation S24, wherein power is applied to the thin board 11 and the first projecting electrode parts 50, while the thin board 11 and the first projecting electrode parts 50 are immersed in an electrolyte, and the first openings 15 are formed on the one side 12 of the thin board 11.

As illustrated in FIG. 10, forming the first openings 15 in operation S21 may be performed while the thin board 11 and the first projecting electrode parts 50 are spaced apart from each other and immersed in the processing tub 19 filled with an electrolyte, the thin board 11 and the first projecting electrode parts 50 are electrically connected with each other, and power is applied to the thin board 11 and the first projecting electrode parts 50 through a power supply unit.

Here, when the first projecting electrode parts 50 and the thin board 11 are respectively made to be a cathode and an anode and power is applied thereto, the one side 12 of the thin board 11 is processed to have the same forms as the cross-sections of the first projecting electrode parts 50 facing the one side 12 of the thin board 11 and thereby, the first openings 15 may be formed.

The cross-sections of the first projecting electrode parts 50 may be the same as the cross-sections of the first openings 15, which are to be formed.

Also, intervals of the first projecting electrode parts 50 arrayed on the first multi array electrode 40 may be the same as the intervals of the first openings 15 arrayed on the one side 12 of the thin board 11.

Here, the first projecting electrode parts 50 may each have inclined sides 54 which become narrow toward the end parts thereof 50 and thereby, the first projecting electrode parts 50 may have a tapered form.

Then, in first ECM in operation S24, when a current is applied to the first projecting electrode parts 50, the current may be centered to the end parts of the first projecting electrode parts 50 and thus, efficiency of ECM may increase.

Also, as illustrated in FIG. 11, in first ECM in operation S24, the first openings 15 having a tapered form, which has a wide inlet and becomes narrow toward the lower part, may be formed on the one side 12 of the thin board 11 according to the first projecting electrode parts 50 having tapered cross-sections.

Figure 12:
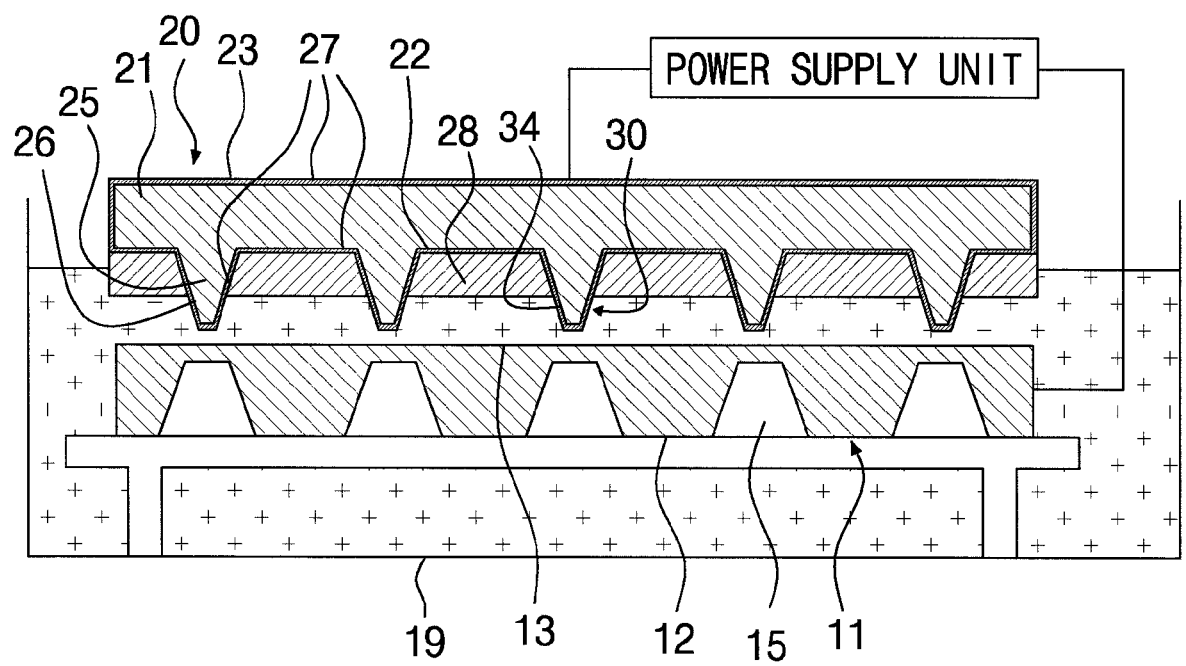

FIG. 12 is an example schematically illustrating a process of forming the second openings.

Referring to FIG. 12, forming the second openings in operation S22 may include aligning the second multi array electrode in operation S25, wherein the second multi array electrode 20 is aligned on and spaced apart from the opposite side 13 of the thin board 11 so that the second projecting electrode parts 30 may face the first openings 15, and second ECM in operation S26, wherein power is applied to the thin board 11 and the second projecting electrode parts 30, while the thin board 11 including the first openings 15 and the second projecting electrode parts 30 are immersed in an electrolyte, and the second openings 16 are formed on the opposite side 13 of the thin board 11 to communicate with the first openings 15.

Forming of the second openings in operation S22 according to the second embodiment of the present invention is substantially the same as forming of the second openings in operation S12 according to the first embodiment of the present invention and thus, detailed description thereof may be referred to the description of the first embodiment.

As described above, the method S20 of manufacturing the organic deposition mask according to the second embodiment of the present invention is different from the method S10 of manufacturing the organic deposition mask according to the first embodiment of the present invention in that instead of etching, forming of the first openings in operation S21 is performed by ECM using the first multi array electrode 40 having the first projecting electrode parts 50 arrayed thereon, as in forming of the second openings in operation S22.

Figure 13:
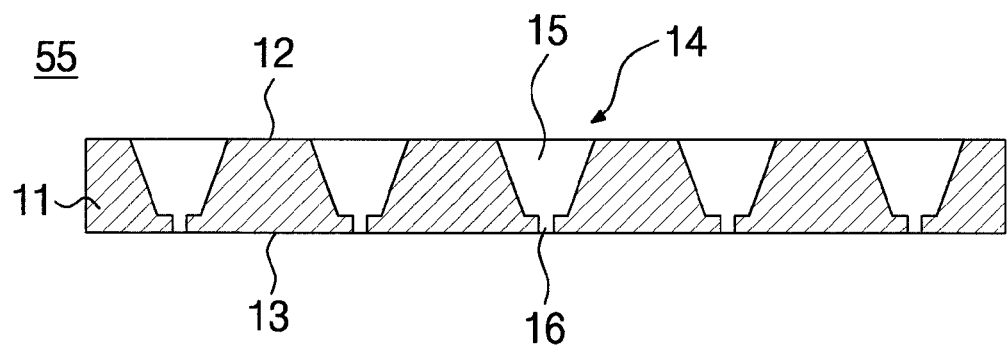

FIG. 13 schematically illustrates the organic deposition mask 55 manufactured by using the method S20 of manufacturing an organic deposition mask according to the second embodiment of the present invention.

As illustrated in FIG. 13, compared with the organic deposition mask 10 (refer to FIG. 1) manufactured by using the method S10 of manufacturing an organic deposition mask according to the first embodiment of the present invention, widths of inlets of the first openings 15 in the organic deposition mask 55 manufactured by using the method S20 of manufacturing the organic deposition mask according to the second embodiment of the present invention are reduced and thereby, intervals of the deposition opening 14 may be reduced. Accordingly, high resolution may be realized in OLED display devices.

Detailed forms of first multi array electrode 40 and the first projecting electrode parts 50 may be substantially the same as those of the second multi array electrode 20 and the second projecting electrode parts 30.

Referring to FIG. 10, the first multi array electrode 40 may include a first substrate 41, first projecting parts 45 arrayed on one side 42 of the first substrate 41, and a first plating layer 47 formed on the surface of the first substrate 41.

Here, the first projecting electrode parts 50 may be formed by forming the first plating layer 47 on the surface of the first projecting parts 45.

The first substrate 41 may be a Si wafer.

The first projecting parts 45 are frames of the first projecting electrode parts 50 and may have the same form as the form of the first projecting electrode parts 50. Also, the first projecting parts 45 may be arrayed as in the same manner as in the arrayed pattern of the first projecting electrode parts 50.

That is, the first projecting parts 45 may each have inclined sides 46 which become narrow toward the end parts of the first projecting parts 45 and thereby, the first projecting parts 45 may have a tapered form.

Also, the pattern of the first projecting parts 45 arrayed on the first substrate 41 may be the same as the pattern of the first openings 15 and accordingly, intervals of the first projecting parts 45 arrayed on the first substrate 41 may be the same as the intervals of the first openings 15 arrayed on the one side 12 of the thin board 11.

In addition, the cross-sections of the first projecting parts 45 may be the same as the cross-sections of the first openings 15 which are to be formed. Although the vertical sections of the first projecting parts 45 are trapezoids according to the drawing, the present invention is not limited thereto and the vertical sections of the first projecting parts 45 may have a conical form having a sharp end parts such as a quadrangular pyramid and a circular cone.

The first multi array electrode 40 may further include a first insulator part 48 interposed between the first projecting electrode parts 50. The first plating layer 47 may be formed on the entire surface of the first substrate 41, that is, the one side 42 and an opposite side 43 of the first substrate 41, the surface of the first projecting parts 45, and sides 44 of the first substrate 41.

Then, the first projecting electrode parts 50 and the opposite side 43 of the first substrate 41 may be electrically connected to each other through the s first plating layer 47. Accordingly, in first ECM in operation S24, a current may be applied to the whole first projecting electrode parts 50 through the opposite side 43 of the one side 42 of the first substrate 41, on which the first projecting electrode parts 50 are arrayed.

Elements included in the first multi array electrode 40 are substantially the same as those included in the second multi array electrode 20 and thus, detailed description of the first multi array electrode 40 may be referred to that of the second multi array electrode 20.

The size of the first projecting electrode parts 50 may be larger than the size of the second projecting electrode parts 30. For example, width and/or height of the first projecting electrode parts 50 may be greater than width and/or height of the second projecting electrode parts 30.

Then, time used to form the first openings 15 by the first projecting electrode parts 50 may be reduced and the size of the first openings 15 may be formed to be larger than the size of the second openings 16.

Also, intensity of a current applied to the first projecting electrode parts 50 in first ECM in operation S24 may be greater than intensity of a current applied to the second projecting electrode parts 30 in second ECM in operation S26.

Then, as in the case where the size of the first projecting electrode parts 50 is formed to be larger than the size of the second projecting electrode parts 30, time for forming the first openings 15 may be reduced. This is because when intensity of applied current increases, machining accuracy is reduced, whereas machining speed is increased, even if the size of the first projecting electrode parts 50 is the same as the size of the second projecting electrode parts 30.

Also, the size of the first projecting electrode parts 50 may be formed to be the same as the size of the second projecting electrode parts 30 and intensity of a current applied to the first projecting electrode parts 50 in first ECM in operation S24 may be greater than intensity of a current applied to the second projecting electrode parts 30 in second ECM in operation S26.

As described above, in forming the first openings 15, machining speed is more important than machining accuracy and in forming the second openings 16, machining accuracy is more important than machining speed.

Figure 14:
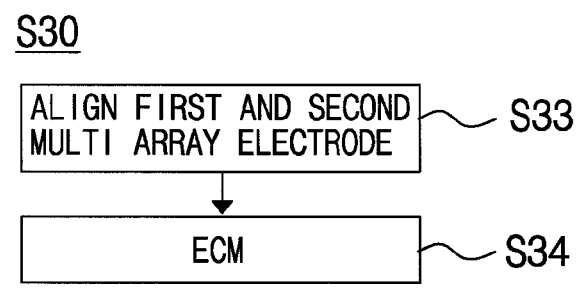
FIG. 14 is a flowchart illustrating a method of manufacturing an organic deposition mask according to a third embodiment of the present invention.
Figure 15:
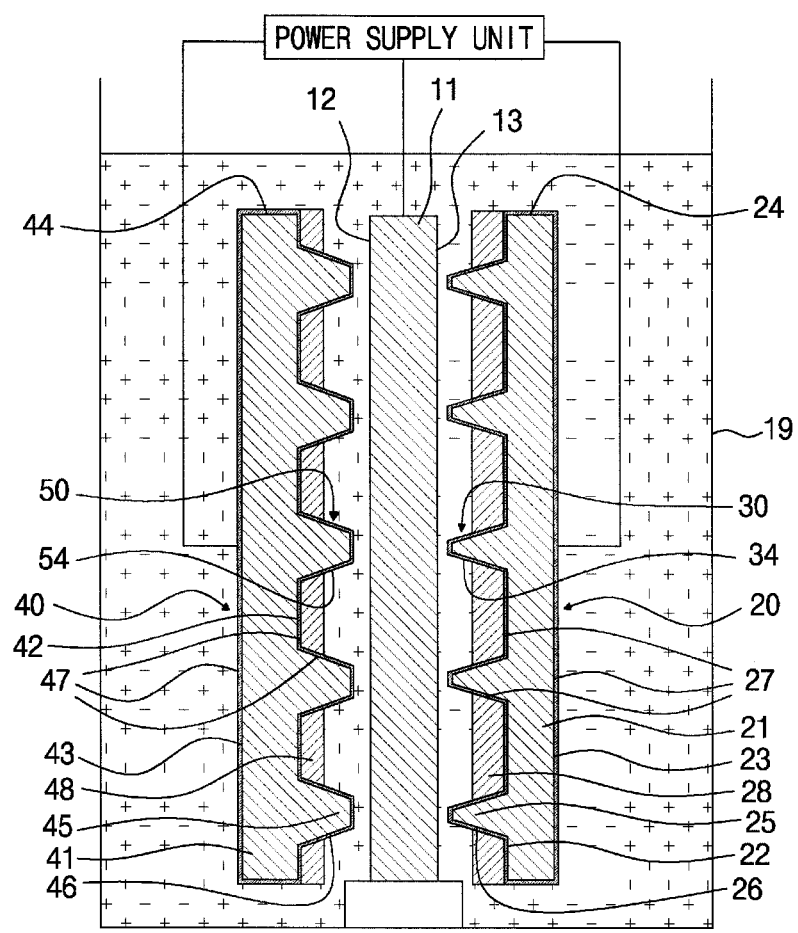
FIG. 15 schematically illustrates an example of the method of manufacturing an organic deposition mask according to the third embodiment of the present invention.

FIG. 14 is a flowchart illustrating a method S30 of manufacturing an organic deposition mask according to a third embodiment of the present invention and FIG. 15 schematically illustrates an example of the method S30 of manufacturing an organic deposition mask according to the third embodiment of the present invention.

Referring to FIGS. 14 and 15, the method S30 of manufacturing an organic deposition mask according to the third embodiment of the present invention is different from the method S20 of manufacturing an organic deposition mask according to the third embodiment of the present invention in that forming of first openings in operation S21 and forming of second openings in operation S22 according to the second embodiment are performed at the same time in the method S30 of manufacturing an organic deposition mask according to the third embodiment of the present invention. Accordingly, only the differences will be described below and other detailed description is referred to the description detailed in the second embodiment.

The method S30 of manufacturing an organic deposition mask according to the third embodiment of the present invention may include aligning the first and second multi array electrodes 40 and 20 in operation S33, wherein the first multi array electrode 40 is aligned on and spaced apart from the one side 12 of the thin board 11 and the second multi array electrode 20 is aligned on and spaced apart from the opposite side 13 of the thin board 11 so that the second projecting electrode parts 30 may face the first projecting electrode parts 50, and ECM in operation S34, wherein power is applied to the thin board 11, the first projecting electrode parts 50, and the second projecting electrode parts 30, while the thin board 11, the first projecting electrode parts 50, and the second projecting electrode parts 30 are immersed in an electrolyte, and the first openings 15 and the second openings 16 are respectively formed on the one side 12 and the opposite side 13 of the thin board 11 at the same time to communicate with each other.

Then, time for manufacturing the organic deposition mask 55 illustrated in FIG. 13 may be significantly reduced.

As illustrated in FIG. 15, in the method S30 of manufacturing an organic deposition mask according to the third embodiment of the present invention, the first projecting electrode parts 50 and the second projecting electrode parts 30 are spaced apart from each other by the thin board 11 interposed therebetween and each immersed in the processing tub 19 filled with an electrolyte. Then, the first and second projecting electrode parts 50 and 30 are electrically connected to the thin board 11 and power is applied to the first projecting electrode parts 50, the second projecting electrode parts 30 and the thin board 11 through a power supply unit.

Here, when the first and second projecting electrode parts 50 and 30 and the thin board 11 are respectively made to be a cathode and an anode and power is applied thereto, the one side 12 of the thin board 11 is processed to have the same forms as the cross-sections of the first projecting electrode parts 50 facing the one side 12 of the thin board 11 and the opposite side 13 of the thin board 11 is processed to have the same forms as the cross-sections of the second projecting electrode parts 30 facing the opposite side 13 of the thin board 11. Therefore, the first openings 15 and the second openings 16 may be formed at the same time.

In addition, as in the second embodiment, the size of the first projecting electrode parts 50 may be larger than the size of the second projecting electrode parts 30 and intensity of a current applied to the first projecting electrode parts 50 may be greater than intensity of a current applied to the second projecting electrode parts 30. Detailed description thereof may be referred to the description of the second embodiment.

That is, as in the second embodiment, in the method S30 according to the third embodiment, the sizes of the first projecting electrode parts 50 and the second projecting electrode parts 30 may be formed to be different from each other or different intensity of a current may be applied to the first projecting electrode parts 50 and the second projecting electrode parts 30. Accordingly, machining speed and accuracy in the one side 12 and the opposite side 13 of the thin board 11 may be controlled.

Figure 16:
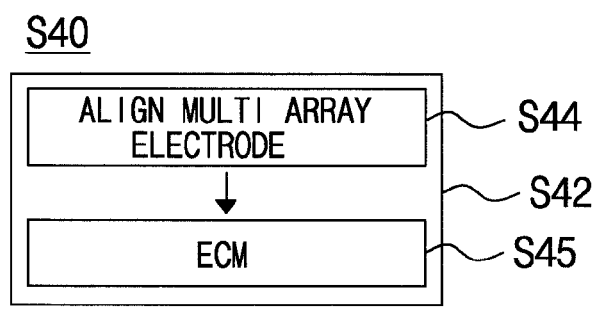
FIG. 16 is a flowchart illustrating a method of manufacturing an organic deposition mask according to a fourth embodiment of the present invention.
Figure 17:
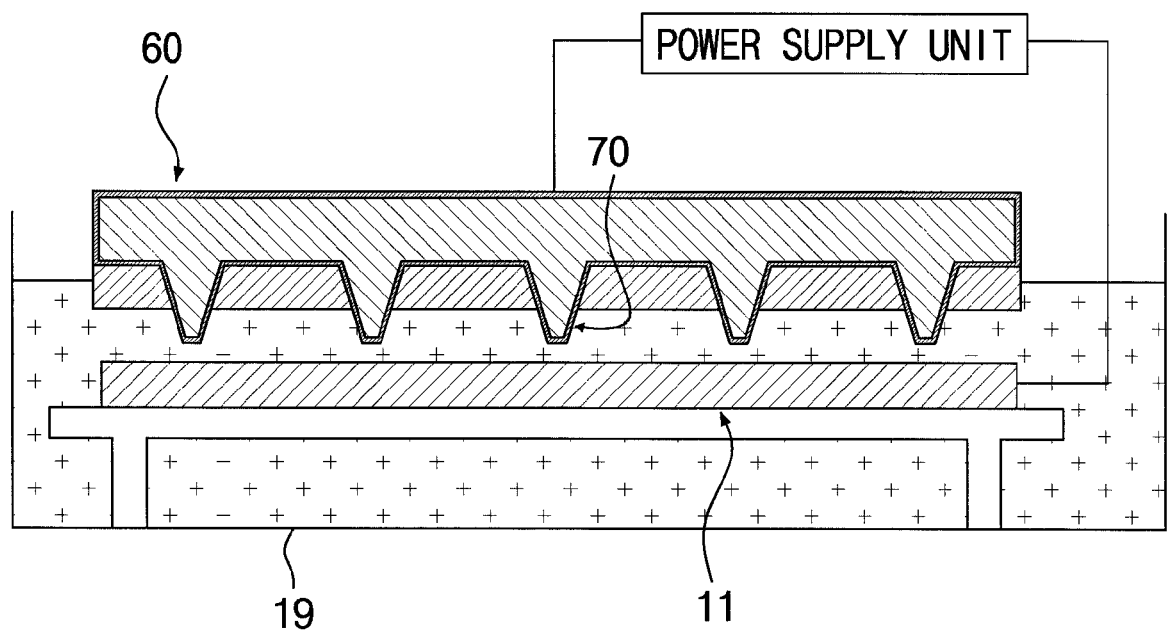
FIG. 17 schematically illustrates an example of the method of manufacturing an organic deposition mask according to the fourth embodiment of the present invention.
Figure 18:
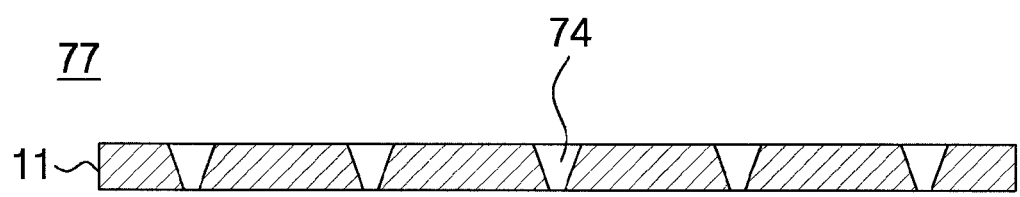
FIG. 18 schematically illustrates an organic deposition mask manufactured by using the method of manufacturing an organic deposition mask according to the fourth embodiment of the present invention.

FIG. 16 is a flowchart illustrating a method S40 of manufacturing an organic deposition mask according to a fourth embodiment of the present invention, FIG. 17 schematically illustrates an example of the method S40 of manufacturing an organic deposition mask according to the fourth embodiment of the present invention and FIG. 18 schematically illustrates an organic deposition mask manufactured by using the method S40 of manufacturing an organic deposition mask according to the fourth embodiment of the present invention.

Referring to FIGS. 16 through 18, the method S40 of manufacturing an organic deposition mask according to the fourth embodiment of the present invention may include forming deposition openings in operation S42, wherein deposition openings 74 are formed on the thin board 11 by ECM using a multi array electrode 60 having projecting electrode parts 70 arrayed thereon.

Forming the deposition openings in operation S42 may include aligning the multi array electrode in operation S44, wherein the multi array electrode 60 is aligned on and spaced apart from the one side 12 of the thin board 11, and ECM in operation S45, wherein power is applied to the thin board 11 and the projecting electrode parts 70, while the thin board 11 and projecting electrode parts 70 are immersed in an electrolyte, and the deposition opening 74 are formed.

As illustrated in FIG. 17, the method S40 of manufacturing an organic deposition mask according to the fourth embodiment of the present invention may be performed while the thin board 11 and the projecting electrode parts 70 are spaced apart from each other and immersed in the processing tub 19 filled with an electrolyte, the thin board 11 and the projecting electrode parts 70 are electrically connected with each other, and power is applied to the thin board 11 and the projecting electrode parts 70 through a power supply unit.

Here, when the projecting electrode parts 70 and the thin board 11 are respectively made to be a cathode and an anode and power is applied thereto, the thin board 11 is processed to have the same forms as the cross-sections of the projecting electrode parts 70 facing the thin board 11 and thereby, the deposition opening 74 may be formed.

Respective elements included in the multi array electrode 60 and the projecting electrode parts 70 are substantially the same as those included in the first and second multi array electrodes 20 and 40 and the first and second projecting electrode parts 30 and 50 and thus, detailed descriptions of the multi array electrode 60 and the projecting electrode parts 70 may be referred to those described in the embodiments above.

As illustrated in FIG. 18, the organic deposition mask 77 manufactured by using the method S40 according to the fourth embodiment of the present invention may have the deposition openings 74 having a tapered form, which has a wide inlet and becomes narrow toward the lower part, on the thin board 11 according to the projecting electrode parts 70 having tapered cross-sections.

That is, in the method S40 of manufacturing an organic deposition mask according to the fourth embodiment of the present invention, compared with the method S30 of manufacturing an organic deposition mask according to the third embodiment of the present invention, the deposition openings 74 may be formed by one ECM using one multi array electrode 60 having the projecting electrode parts 70 arrayed thereon and thus, a thickness of the thin board 11 may need to be very thin.

Hereinafter, a method of manufacturing a multi array electrode having projecting electrode parts arrayed thereon according to an embodiment of the present invention will be described with reference to the drawings.

The multi array electrode having projecting electrode parts arrayed thereon is firstly described before the method of manufacturing the multi array electrode is described.

The multi array electrode according to an embodiment of the present invention includes the projecting electrode parts arrayed thereon, wherein the projecting electrode parts may be used to accurately form micro holes, and thus, may be used in manufacturing of an organic deposition mask having fine deposition openings.

For example, in the multi array electrode according to an embodiment of the present invention, hundreds of thousands to millions of vertical projecting electrode parts, which may process microscale pitch holes, are arrayed at fixed intervals. When such multi array electrode is used to manufacture an organic deposition mask used in manufacturing of OLEDs by ECM, an organic deposition mask supporting resolution of 600 ppi or higher may be manufactured.

The multi array electrode according to an embodiment of the present invention is not limited to manufacture an organic deposition mask and may be widely used in large numbers of electronic components such as photoelectric cells and thermal-electric devices.

Figure 19:
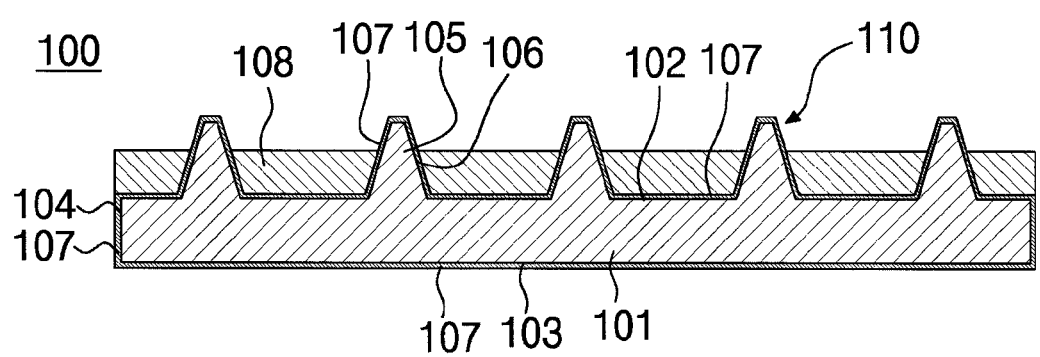
FIG. 19 schematically illustrates a multi array electrode having projecting electrode parts arrayed thereon according to an embodiment of the present invention.

FIG. 19 schematically illustrates a multi array electrode 100 having projecting electrode parts 110 arrayed thereon according to an embodiment of the present invention.

Referring to FIG. 19, the multi array electrode 100 according to an embodiment of the present invention may substantially have the same structure as the second multi array electrode 20 (refer to FIGS. 7 and 8).

That is, the multi array electrode 100 having the projecting electrode parts 110 arrayed thereon may include a substrate 101, projecting parts 105 arrayed on one side 102 of the substrate 101, and a plating layer 107 formed on the surface of the substrate 101. The projecting electrode parts 110 may be formed by forming the plating layer 107 on the surface of the projecting parts 105.

The substrate 101 may be a Si wafer. The projecting parts 105 are frames of the projecting electrode parts 110 and may have the same form as the form of the projecting electrode parts 110. Also, the projecting parts 105 may be arrayed as in the same manner as in the arrayed pattern of the projecting electrode parts 110.

For example, the projecting parts 105 may each have inclined sides 106 which become narrow toward the end parts thereof and thereby, the projecting parts 105 may have a tapered form.

Also, horizontal sections of the projecting parts 105 may be various forms such as a circle or a rectangle. Although the vertical sections of the projecting parts 105 are trapezoids according to the drawing, the present invention is not limited thereto and the vertical sections of the projecting parts 105 may have a conical form having a sharp end parts such as a quadrangular pyramid and a circular cone.

As such, when the projecting electrode parts 110 narrow toward the end parts and have sharp end parts, a current may be centered to the end parts of the projecting electrode parts 110, when applying a current and thus, machining accuracy may increase.

Also, the multi array electrode 100 according to an embodiment of the present invention may further include an insulator part 108 interposed between the projecting electrode parts 110. When the insulator part 108 is formed on the part excluding the projecting electrode parts 110, the part excluding the projecting electrode parts 110 may be prevented from diffusion of a current and thereby, manufacturing of fine holes may be available.

In addition, the plating layer 107 may be formed on the entire surface of the substrate 101, that is, the one side 102 and an opposite side 103 of the substrate 101, the surface of the projecting parts 105, and sides 104 of the substrate 101.

Then, the whole projecting electrode parts 110 and the opposite side 103 of the substrate 101 may be electrically connected to each other through the plating layer 107. Accordingly, in ECM, a current may be applied to the whole projecting electrode parts 110 through the opposite side 103 of the one side 102 of the substrate 101, on which the projecting electrode parts 110 are arrayed.

Hereinafter, a method of manufacturing a multi array electrode having projecting electrode parts arrayed thereon according to an embodiment of the present invention will be described with reference to the drawings.

Figure 20:
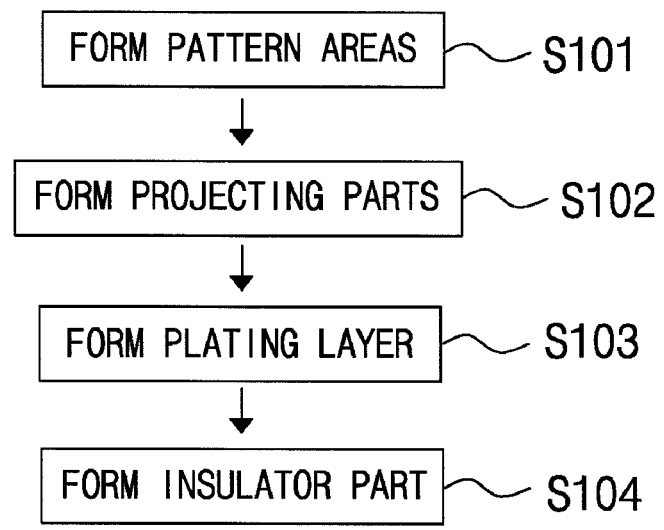
FIG. 20 is a flowchart illustrating a method of manufacturing a multi array electrode having projecting electrode parts arrayed thereon according to an embodiment of the present invention.

FIG. 20 is a flowchart illustrating a method S100 of manufacturing a multi array electrode having projecting electrode parts arrayed thereon according to an embodiment of the present invention and FIGS. 21 through 27 illustrate processes in the method S100 of manufacturing a multi array electrode having projecting electrode parts arrayed thereon according to an embodiment of the present invention.

Firstly, referring to FIG. 20, the method S100 of manufacturing a multi array electrode having projecting electrode parts arrayed thereon according to an embodiment of the present invention may include forming pattern areas in operation S101, forming projecting parts in operation S102, forming a plating layer in operation S103, and forming an insulator part in operation S104.

In forming pattern areas in operation S101, pattern areas 120 for forming the projecting electrode parts 110 are formed on the one side 102 of the substrate 101. In forming projecting parts in operation S102, the one side 102 of the substrate 101, on which the pattern areas 120 are formed, is etched to form the projecting parts 105 forming the projecting electrode parts 110 on the one side 102 of the substrate 101. In forming a plating layer in operation S103, the plating layer 107 is formed on the surface of the substrate 101. In forming an insulator part in operation S104, the insulator part 10 are formed between the projecting electrode parts 110.

Figure 21:
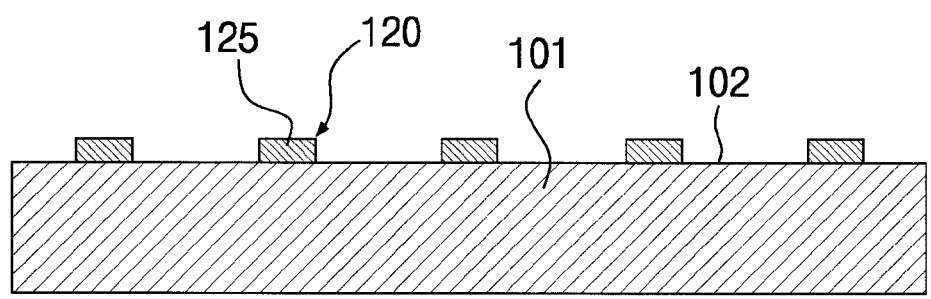
FIG. 21 schematically illustrates that pattern areas are formed on a substrate after a process of forming of pattern areas according to an embodiment of the present invention.

FIG. 21 schematically illustrates that the pattern areas 120 are formed on the substrate 101 after forming pattern areas in operation S101 according to an embodiment of the present invention.

Referring to FIG. 21, forming pattern areas in operation S101 is performed for forming the pattern areas 120 before performing a lithography process for forming the projecting parts 105 on the Si wafer substrate 101, which has an excellent flatness and is easily handled. Here, the pattern areas 120 may be formed by using photoresists 125.

In forming pattern areas in operation S101 by using the photoresists 125, the photoresists 125 are coated on the one side 102 of the substrate 101, a photo mask including the pattern areas 120 is placed on the photoresists 125, light is irradiated to the photo mask, the photoresists 125, to which light is irradiated, are developed, and thereby, the pattern areas 120 may be formed on the one side 102 of the substrate 101, on which the photoresists 125 are coated.

Here, when the photoresists 125 are the negative type, a part excluding the pattern areas 120 only remains through the developing process. When the photoresists 125 are the positive type, the pattern areas 120 only remain through the developing process.

As illustrated in FIG. 21, in forming pattern areas in operation S101 according to the current embodiment of the present invention, the positive type photoresists 125 may be used.

In the current embodiment of the present invention, the photoresists 125 are used to form the pattern areas 120, however, the present invention is not limited thereto. For example, a dry film photoresist (DFP) may be used to form the pattern areas 120 and the present invention is not restricted by the forming of the pattern areas 120.

Figure 22:
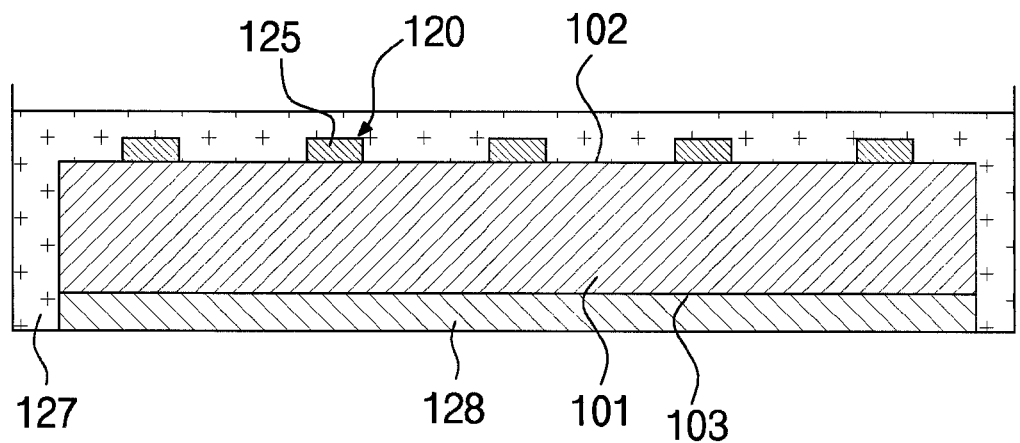
FIGS. 22 through 24 illustrate a process of forming projecting parts according to an embodiment of the present invention, wherein FIG. 22 schematically illustrates a first etching process in forming projecting parts according to an embodiment of the present invention, FIG. 23 schematically illustrates that the projecting parts are formed on a substrate after the first etching process of FIG. 22, and FIG. 24 schematically illustrates that the projecting parts having inclined sides are formed on a substrate after a second etching process of FIG. 22.
Figure 23:
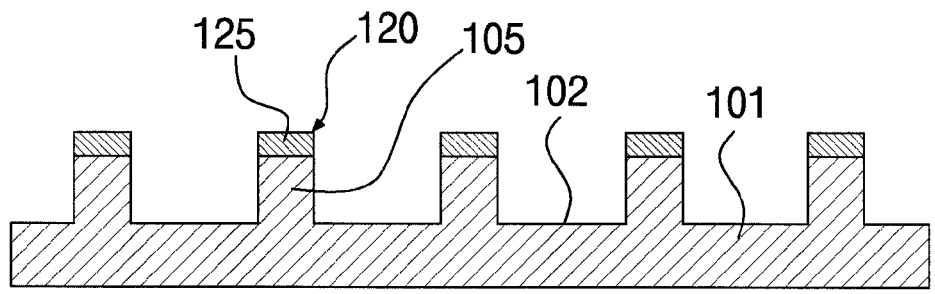
Figure 24:
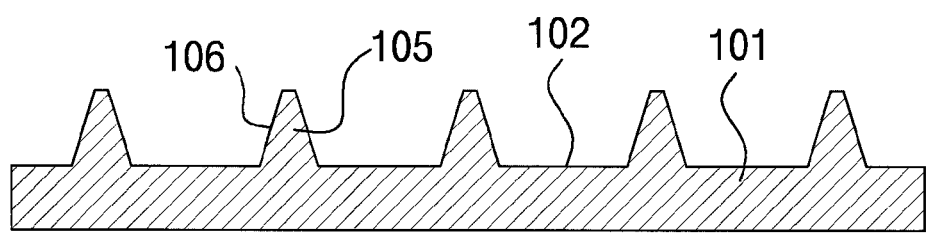

FIGS. 22 through 24 illustrate forming projecting parts according to an embodiment of the present invention, wherein FIG. 22 schematically illustrates a first etching process in the forming projecting parts according to an embodiment of the present invention, FIG. 23 schematically illustrates that the projecting parts 105 are formed on the substrate 101 after the first etching process of FIG. 22, and FIG. 24 schematically illustrates that the projecting parts 105 having the inclined sides 106 are formed on the substrate 101 after a second etching process of FIG. 22.

Referring to FIGS. 22 through 24, forming projecting parts in operation S102 according to an embodiment of the present invention may include a first etching process and a second etching process, wherein in the first etching process, an area excluding the pattern areas 120 is etched to form the projecting parts 105 on the pattern areas 120 and in the second etching process, the substrate 101 including the projecting parts 105 is etched to form the inclined sides 106 at the sides of the projecting parts 105 so that widths of the projecting parts 105 become narrow toward the end parts thereof.

The first etching process is to form the projecting parts 105 having a great aspect ratio (aspect ratio of about 5:1 or higher) on the pattern areas 120 for forming the projecting electrode parts 110 and may be electrochemical etching.

FIG. 22 schematically illustrates that the projecting parts 105 are formed by using electrochemical etching, which is one of examples of the first etching process, according to an embodiment of the present invention.

As illustrated in FIG. 22, the electrochemical etching, which is one of examples of the first etching process, according to an embodiment of the present invention may be performed by immersing the substrate 101 including the pattern areas 120 in an electrolyte solution 127 and applying power through an electrode 128, while the opposite side 103 of the one side 102 of the substrate 101 joins the electrode 128.

Here, the electrolyte solution may be hydrofluoric acid (HF), ethanol, a cetyltrimethyl ammonium chloride (CTAC) solution, or a deionized water added solution and temperature of the electrolyte solution may maintain about 25° C. The electrode 128 may be an aluminum (AL) thin film.

Then, as illustrated in FIG. 23, after the first etching process using electrochemical etching, the projecting parts 105 having a great aspect ratio may be formed on the substrate 101.

Here, in the projecting parts 105, the form and pitch intervals of the projecting parts 105 are determined when the photoresists 125 are patterned in forming pattern areas in operation S101 and the diameter and height of the projecting parts 105 may be controlled according to the density of a current during electrochemical etching.

Although the vertical projecting parts 105 are illustrated in the drawing as an example of the projecting parts 105 formed after electrochemical etching, the projecting parts 105 formed after electrochemical etching are not always vertical and inclined sides may be formed at sides of the projecting parts 105. The present invention is not limited thereto.

As another embodiment, the first etching process may be dry etching.

In dry etching, soluble chemicals are not used, reactive gas is exposed in plasma, and a target object, which needs to be removed, is made to be volatile gas and is etched. Since the dry etching is anisotropic etching, the lower parts of the photoresists 125 forming the pattern areas 120 are not etched as illustrated in FIG. 23, and the parts having the same width as the widths of the pattern areas 120 may be etched. Accordingly, the widths of the pattern areas 120 may be regularly formed and the projecting parts 105 having a great aspect ratio may be formed.

In addition, the second etching process may be wet etching. Here, a potassium hydroxide (KOH) solution may be used in wet etching.

As illustrated in FIG. 24, when the second etching process using wet etching is performed after the first etching process, the projecting parts 105 having a great aspect ratio incline as a pyramid form and are changed to have sharp ends, as time passed. Accordingly, the inclined sides 106 may be formed on the sides of the projecting parts 105 having a great aspect ratio and thereby, the projecting parts 105 may have a tapered form, which become narrow toward the end parts thereof.

Here, when the etching time extends, the projecting parts 105 may be formed in a form of cone having sharp ends.

The second etching process may be performed after performing the first etching process and removing the photoresists 125.

Figure 25:
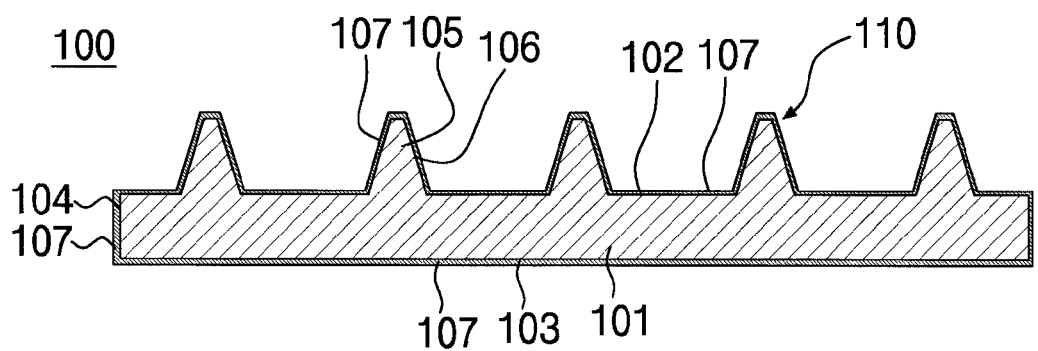
FIG. 25 schematically illustrates where a plating layer is formed on a substrate including the projecting parts after forming a plating layer according to an embodiment of the present invention.

FIG. 25 schematically illustrates the multi array electrode 100 where the plating layer 107 is formed on the substrate 101 including the projecting parts 105 after forming the plating layer in operation S103 according to an embodiment of the present invention.

Referring to FIG. 25, after forming projecting parts in operation S102, forming a plating layer in operation S103 is performed for the projecting parts 105 to function as the projecting electrode parts 110. Here, a metal (Pt, Au, Pd, or Ag) having excellent conductivity is deposited on the surface of the projecting parts 105 and thereby, the plating layer 107 may be formed on the surface of the projecting parts 105.

That is, in forming a plating layer in operation S103, the plating layer 107 is formed on the surface of the projecting parts 105 and thus, the projecting electrode parts 110 are formed.

Here, in forming a plating layer in operation S103, the plating layer 107 may be formed on the entire surface of the substrate 101, that is, the one side 102, the opposite side 103, and the sides 104 of the substrate 101, and the surface of the projecting parts 105, in order for the entire substrate 101 to function as an electrode.

In addition, in forming a plating layer in operation S103, about 50 nm of Ti, Cr, or Pd is deposited on the substrate 101 as a seed layer before the plating layer 107 with a metal having excellent conductivity is formed on the surface of the substrate 101. Accordingly, a metal having excellent conductivity may be smoothly formed on the substrate 101.

Figure 26:
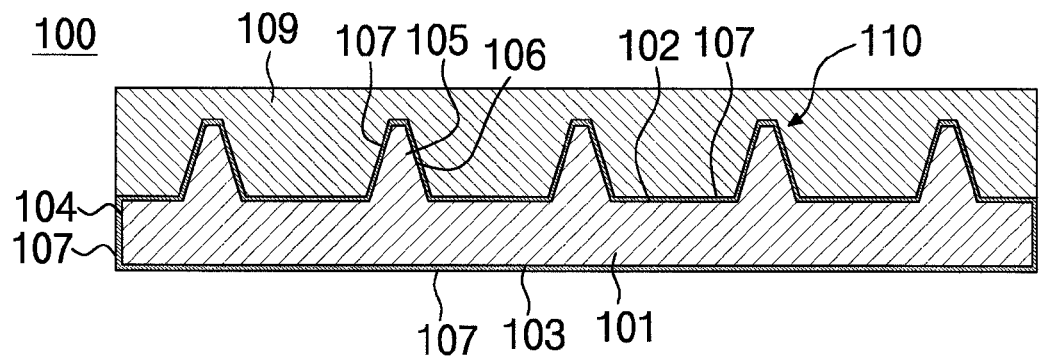
FIGS. 26 and 27 illustrate a process of forming an insulator part according to an embodiment of the present invention, wherein FIG. 26 schematically illustrates that an insulator layer is formed on a substrate after a forming process of the insulator layer in forming an insulator part according to an embodiment of the present invention and FIG. 27 schematically illustrates an example of a removing process of an insulator layer in forming an insulator part according to an embodiment of the present invention.
Figure 27:
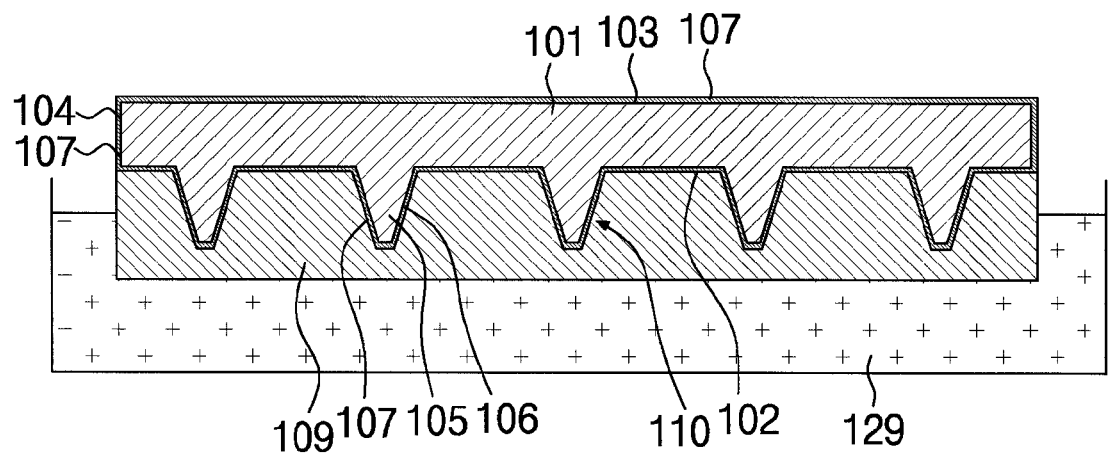

FIGS. 26 and 27 illustrate forming an insulator part according to an embodiment of the present invention, wherein FIG. 26 schematically illustrates that an insulator layer 109 is formed on the substrate 101 after a forming process of the insulator layer 109 in forming an insulator part in operation S104 according to an embodiment of the present invention and FIG. 27 schematically illustrates an example of a removing process of the insulator layer 109 in forming an insulator part in operation S104 according to an embodiment of the present invention.

Referring to FIGS. 26 and 27, in forming an insulator part in operation S104 according to an embodiment of the present invention, a part remaining after excluding the end parts of the projecting electrode parts 110 in the substrate 101, which becomes conductive after forming a plating layer in operation S103, is insulated in order to prevent diffusion of a current during ECM and to improve machining accuracy and efficiency.

Forming an insulator part in operation S104 may include forming an insulator layer, wherein the insulator layer 109 is formed on the one side 102 of the substrate 101, on which the projecting electrode parts 110 are formed, and removing an insulator layer, wherein the insulator layer 109 formed on the end parts of the projecting electrode parts 110 is removed.

As illustrated in FIG. 26, after forming plating layer in operation S103, the insulator layer 109 may be formed on the one side 102 of the substrate 101, on which the projecting electrode parts 110 are formed. Here, the insulator layer 109 may be formed of silicon oxide ($SiO_2$) or silicon nitride (SiN).

In addition, as illustrated in FIG. 27, removing an insulator layer may be performed by immersing only end parts of the projecting electrode parts 110 from the insulator layer 109 formed on the one side 102 of the substrate 101 in a solution 129 for removing an insulator layer.

Here, the solution 129 for removing an insulator layer may be hydrofluoric acid (HF) or a phosphoric aqueous solution.

Then, the multi array electrode 100 of FIG. 19 may be finally manufactured.

That is, the multi array electrode 100 manufactured by using the methods according to the embodiments of the present invention may have a structure including an electrode part and a power supply unit, wherein the one side 102 of the substrate 101 is to be the electrode part, on which the projecting electrode parts 110 are formed, and the opposite side 103 of the substrate 101 is to be the power supply unit, on which the plating layer 107 for supplying power to the projecting electrode parts 110 is formed.

As described above, the present invention relates to a method of manufacturing an organic deposition mask by ECM using a multi array electrode having projecting electrode parts arrayed thereon so that fine deposition openings may be formed on a thin board and embodiments thereof may be changed in various forms.

In the multi array electrode and the method of manufacturing the organic deposition mask by using the multi array electrode according to the embodiments of the present invention, fine deposition openings are formed on the thin board by ECM using the multi array electrode having the projecting electrode parts arrayed thereon. Accordingly, machining accuracy of the deposition openings is excellent and the organic deposition mask supporting high resolution due to small sizes and intervals of the deposition openings may be manufactured.

Also, in the method of manufacturing the multi array electrode according to the embodiments of the present invention, the multi array electrode having the projecting electrode parts arrayed thereon may be manufactured, wherein the projecting electrode parts may be used to accurately form micro holes.

As described above, the present invention relates to a method of manufacturing an organic deposition mask by ECM using a multi array electrode having projecting electrode parts arrayed thereon so that fine deposition openings may be formed on a thin board.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic deposition mask comprising deposition openings formed of first openings facing a deposition source and second openings facing a deposited object, the method comprising:
   forming the first openings on one side of a board; and
   forming the second openings on an opposite side of the board by electrochemical machining (ECM) using a second multi array electrode having second projecting electrode parts arrayed thereon so as to communicate with the first openings.

2. The method of claim 1, wherein the forming the first openings comprises: forming pattern areas on the one side of the thin board; and etching the pattern areas by a predetermined thickness so as to form the first openings on the one side of the board, and the forming the second openings comprises: aligning a second multi array electrode, wherein the second multi array electrode is aligned on and spaced apart from the opposite side of the board so that the second projecting electrode parts face the first openings; and second ECM, wherein power is applied to the board and the second projecting electrode parts, while the board including the first openings and the second projecting electrode parts are immersed in an electrolyte, and the second openings are formed on the opposite side of the board to communicate with the first openings.

3. The method of claim 2, wherein the second projecting electrode parts comprise inclined sides which become narrow toward the end parts thereof.

4. The method of claim 2, wherein the second multi array electrode comprises a second substrate, second projecting parts arrayed on one side of the second substrate, and a second plating layer formed on the surface of the second substrate, the second projecting electrode parts are formed by forming the second plating layer on the surface of the second projecting parts, and the second multi array electrode further comprises a second insulator part interposed between the second projecting electrode parts.

5. The method of claim 1, wherein the forming the first openings comprises: aligning a first multi array electrode, wherein the first multi array electrode having first projecting electrode parts arrayed thereon is aligned on and spaced apart from the one side of the board; and first ECM, wherein power is applied to the board and the first projecting electrode parts, while the board and the first projecting electrode parts are immersed in a first electrolyte, and the first openings are formed on the one side of the board, and the forming the second openings comprises: aligning the second multi array electrode, wherein the second multi array electrode is aligned on and spaced apart from the opposite side of the board so that the second projecting electrode parts face the first openings; and second ECM, wherein power is applied to the board and the second projecting electrode parts, while the board comprising the first openings and the second projecting electrode parts are immersed in a second electrolyte, and the second openings are formed on the opposite side of the board to communicate with the first openings.

6. The method of claim 5, the size of the first projecting electrode parts is larger than the size of the second projecting electrode parts and/or intensity of a current applied to the first projecting electrode parts in the first ECM is greater than intensity of a current applied to the second projecting electrode parts in the second ECM.

7. The method of claim 5, wherein the first projecting electrode parts and the second projecting electrode parts comprise inclined sides which become narrow toward the end parts thereof.

8. The method of claim 5, wherein the first multi array electrode comprises a first substrate, first projecting parts arrayed on one side of the first substrate, and a first plating layer formed on the surface of the first substrate, the first projecting electrode parts are formed by forming the first plating layer on the surface of the first projecting parts, the second multi array electrode comprises a second substrate, second projecting parts arrayed on one side of the second substrate, and a second plating layer formed on the surface of the second substrate, the second projecting electrode parts are formed by forming the second plating layer on the surface of the second projecting parts, the first multi array electrode further comprises a first insulator part interposed between the first projecting electrode parts, and the second multi array electrode further comprises a second insulator part interposed between the second projecting electrode parts.

9. The method of claim 1, wherein in the forming the first openings, the first openings are formed on the one side of the board by ECM using a first multi array electrode having first projecting electrode parts arrayed thereon and in order to perform the forming the first openings and second openings at the same time, the method comprises: aligning the first and second multi array electrodes, wherein the first multi array electrode is aligned on and spaced apart from the one side of the board and the second multi array electrode is aligned on and spaced apart from the opposite side of the board so that the second projecting electrode parts face the first projecting electrode parts; and ECM, wherein power is applied to the board, the first projecting electrode parts, and the second projecting electrode parts, while the board, the first projecting electrode parts, and the second projecting electrode parts are immersed in an electrolyte, and the first openings and the second openings are respectively formed on the one side and the opposite side of the board at the same time to communicate with each other.

10. The method of claim 9, the size of the first projecting electrode parts is larger than the size of the second projecting electrode parts and/or intensity of a current applied to the first projecting electrode parts is greater than intensity of a current applied to the second projecting electrode parts.

11. The method of claim 9, wherein the first projecting electrode parts and the second projecting electrode parts comprise inclined sides which become narrow toward the end parts thereof.

12. The method of claim 9, wherein the first multi array electrode comprises a first substrate, first projecting parts arrayed on one side of the first substrate, and a first plating layer formed on the surface of the first substrate, the first projecting electrode parts are formed by forming the first plating layer on the surface of the first projecting parts, the second multi array electrode comprises a second substrate, second projecting parts arrayed on one side of the second substrate, and a second plating layer formed on the surface of the second substrate, the second projecting electrode parts are formed by forming the second plating layer on the surface of the second projecting parts, the first multi array electrode further comprises a first insulator part interposed between the first projecting electrode parts, and the second multi array electrode further comprises a second insulator part interposed between the second projecting electrode parts.

13. A method of manufacturing a multi array electrode having projecting electrode parts arrayed thereon, the method comprising:
  forming pattern areas for forming projecting electrode parts on one side of a substrate;
  forming projecting parts for forming the projecting electrode parts on the one side of the substrate by etching the one side of the substrate, on which the pattern areas are formed; and
  forming a plating layer on the surface of the substrate,
  wherein the projecting electrode parts are formed by forming the plating layer on the surface of the projecting parts.

14. The method of claim 13, wherein the forming the projecting parts comprises: first etching, wherein an area excluding the pattern areas is etched to form the projecting parts on the pattern areas, and second etching, wherein the substrate including the projecting parts is etched to form the inclined sides at the sides of the projecting parts so that widths of the projecting parts become narrow toward the end parts thereof.

15. The method of claim 14, wherein the first etching is any one of electrochemical etching and dry etching and the second etching is wet etching.

16. The method of claim 13, further comprising forming an insulator part interposed between the projecting electrode parts.

17. The method of claim 16, wherein the forming the insulator part comprises: forming an insulator layer on the one side of the substrate, where the projecting electrode parts are formed, and removing the insulator layer formed on the end parts of the projecting electrode parts.

* * * * *